(12) United States Patent
Nishizaki et al.

(10) Patent No.: US 9,633,888 B2
(45) Date of Patent: Apr. 25, 2017

(54) SEMICONDUCTOR MANUFACTURING DEVICE AND METHOD OF MANUFACTURING SEMICONDUCTOR CHIP

(71) Applicant: FUJI XEROX CO., LTD., Tokyo (JP)

(72) Inventors: Saori Nishizaki, Kanagawa (JP);
Tomoki Umezawa, Kanagawa (JP);
Hirokazu Matsuzaki, Kanagawa (JP);
Takeshi Minamiru, Kanagawa (JP);
Tatsumi Inomoto, Kanagawa (JP);
Eitoku Sonoda, Kanagawa (JP); Kenji Yamazaki, Kanagawa (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/045,599

(22) Filed: Feb. 17, 2016

(65) Prior Publication Data
US 2016/0293463 A1 Oct. 6, 2016

(30) Foreign Application Priority Data
Apr. 1, 2015 (JP) .................................. 2015-074755

(51) Int. Cl.
*H01L 21/66* (2006.01)
*H01L 21/683* (2006.01)
*H01L 21/67* (2006.01)
*H01L 21/68* (2006.01)

(52) U.S. Cl.
CPC .... *H01L 21/6836* (2013.01); *H01L 21/67132* (2013.01); *H01L 21/681* (2013.01); *H01L 22/12* (2013.01); *H01L 2221/68327* (2013.01); *H01L 2221/68336* (2013.01); *H01L 2221/68381* (2013.01); *H01L 2221/68386* (2013.01)

(58) Field of Classification Search
CPC ....................... H01L 21/6836; H01L 21/67132
See application file for complete search history.

(56) References Cited

U.S. PATENT DOCUMENTS

| | | | |
|---|---|---|---|
| 2002/0069952 A1* | 6/2002 | Kurosawa | H01L 21/67092 156/91 |
| 2003/0060021 A1* | 3/2003 | Kurosawa | H01L 21/67132 438/455 |
| 2007/0082529 A1 | 4/2007 | Nishio et al. | |
| 2008/0318346 A1* | 12/2008 | Maki | H01L 21/67132 438/7 |
| 2016/0258862 A1* | 9/2016 | Shin | G01N 19/04 |

FOREIGN PATENT DOCUMENTS

JP    2007-109680 A    4/2007

* cited by examiner

Primary Examiner — Bradley K Smith
(74) Attorney, Agent, or Firm — Oliff PLC

(57) ABSTRACT

Provided is a semiconductor manufacturing device including an expanding unit that expands a holding member having an adhesive layer on which a substrate in a state of being diced into plural semiconductor chips is held, a detection unit that detects an adhesive state between one of the semiconductor chips and the holding member, in a state in which the holding member is expanded, and a pickup unit that picks up the semiconductor chip by changing an operation relevant to pickup of the semiconductor chip based on the detected adhesive state.

17 Claims, 12 Drawing Sheets

PICKUP FAILURE: AMOUNT OF PEELING IS SMALL

PICKUP FAILURE: AMOUNT OF PEELING IS GREAT

TAKING TWO PIECES: AMOUNT OF PEELING IS GREAT

IMAGE NOT-RECOGNIZED

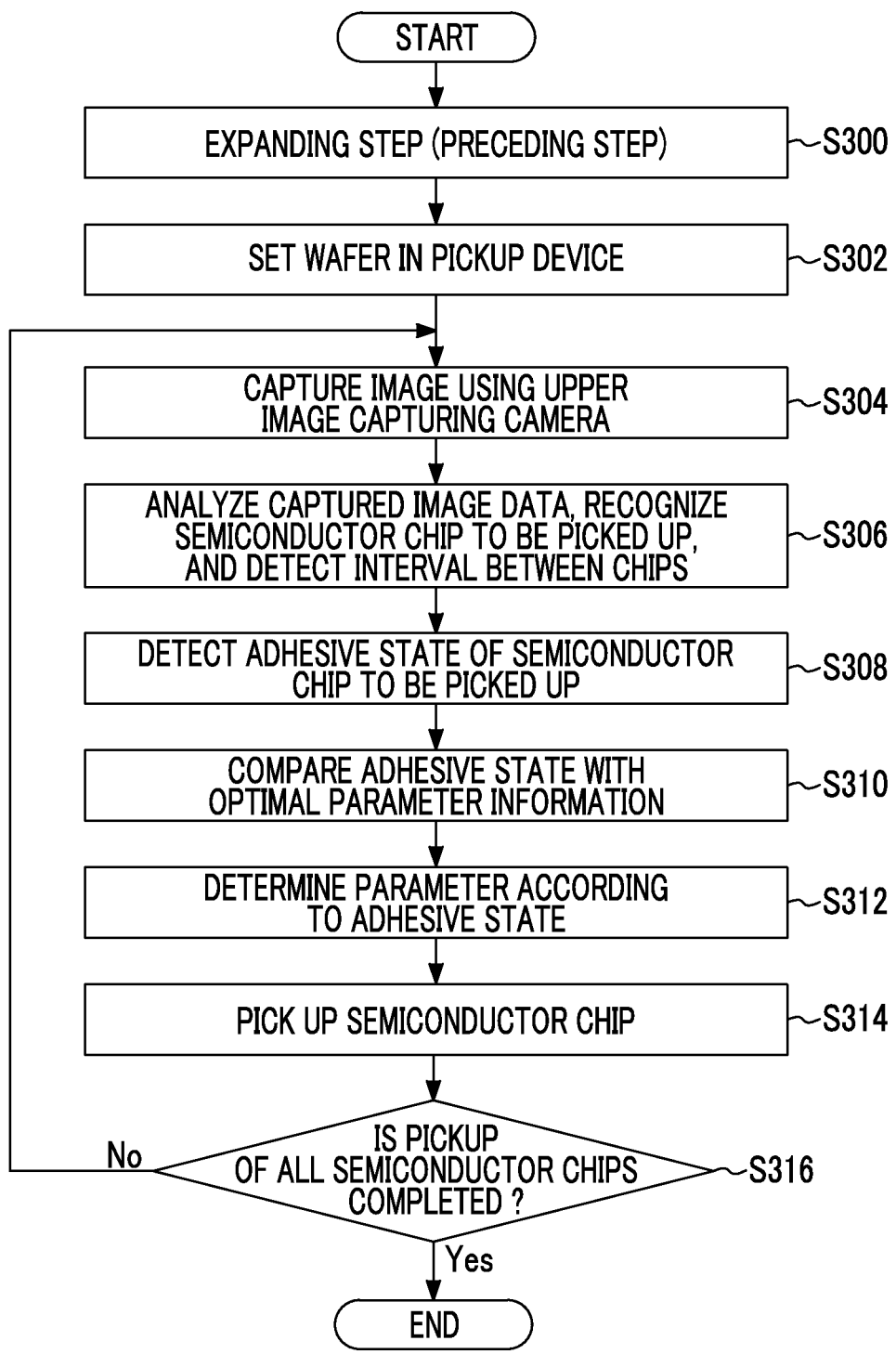

SEMICONDUCTOR MANUFACTURING DEVICE AND METHOD OF MANUFACTURING SEMICONDUCTOR CHIP

CROSS-REFERENCE TO RELATED APPLICATIONS

This application is based on and claims priority under 35 USC 119 from Japanese Patent Application No. 2015-074755 filed on Apr. 1, 2015.

BACKGROUND

Technical Field

The present invention relates to a semiconductor manufacturing device and a method of manufacturing a semiconductor chip.

SUMMARY

According to an aspect of the invention, there is provided a semiconductor manufacturing device including:

an expanding unit that expands a holding member having an adhesive layer on which a substrate in a state of being diced into plural semiconductor chips is held;

a detection unit that detects an adhesive state between one of the semiconductor chips and the holding member, in a state in which the holding member is expanded; and a pickup unit that picks up the semiconductor chip by changing an operation relevant to pickup of the semiconductor chip based on the detected adhesive state.

BRIEF DESCRIPTION OF THE DRAWINGS

Exemplary embodiments of the present invention will be described in detail based on the following figures, wherein:

FIG. 18 is a flowchart in which pickup conditions of a pickup device according to the second example of the present invention is changed.

DETAILED DESCRIPTION

Figure 1A:
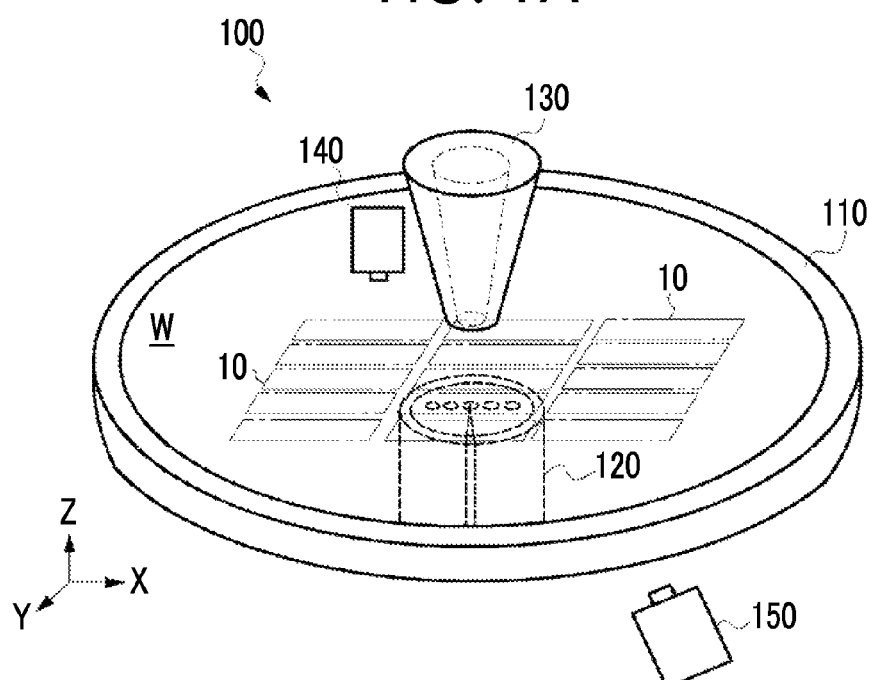
FIG. 1A is a schematic perspective view of a pickup device according to a first example of the present invention.

Steps of manufacturing a semiconductor chip include, for example, a step of forming elements on a surface of a semiconductor substrate or a semiconductor wafer (hereinafter, referred to as a semiconductor substrate or a substrate), a step of attaching a dicing tape to the semiconductor substrate, a step of dicing the semiconductor substrate into semiconductor chips, a step of expanding the dicing tape, a step of picking-up the semiconductor chip from the dicing tape, and a step of mounting the picked semiconductor chip on a circuit substrate or the like. A semiconductor device according to the present invention relates to a pickup device which is used for the picking-up step after the expanding step. The pickup device peels off the semiconductor chip which is held on an adhesive tape such as a dicing tape or an expanding tape from the adhesive tape, and picks up the peeled semiconductor chip by an adsorption member such as a collet. The pickup device may be combined with a device which performs the expanding step which is a preceding step, or a device which performs a die-mounting step which is a subsequent step, and alternatively, may configure a part of the device. The pickup device may be separate from the device.

Elements which are formed on the semiconductor chip are not limited particularly, and may include a light emitting element, a light receiving element, an active element, a passive element, or the like. The light emitting element may be, for example, a surface light emitting type semiconductor laser, a light emitting diode, a light emitting thyristor, or an array in which multiple elements are formed. The light receiving elements may be a contact image sensor or a line sensor. Furthermore, one semiconductor chip may also include a drive circuit or the like which drives elements. In addition, the semiconductor substrate may be configured by, for example, silicon, SiC, a compound semiconductor, a sapphire, or the like, but is not limited to these, and may be a substrate configured by other materials if the substrate contains at least semiconductor. For example, the light receiving element such as a contact image sensor is formed in a silicon substrate, and, for example, a light emitting element such as a surface light emitting type semiconductor laser or a light emitting diode is formed in a compound semiconductor substrate of a group III-V such as GaAs.

A semiconductor chip which is picked up by a pickup device is mounted on a circuit substrate or the like. The circuit substrate on which a semiconductor chip in which a light emitting element or the like is formed is mounted configures a light source of an image forming device or a light transmission device.

Hereinafter, a pickup device will be described in detail with reference to the accompanying drawings, as an example of a semiconductor manufacturing device according to the exemplary embodiment of the present invention. The scale, shape, or the like of the drawing is emphasized such that the characteristics of the invention may be easily understood, and it should be noted that the scale, or the shape, is not the same as that of an actual device.

First Example

Figure 1B:
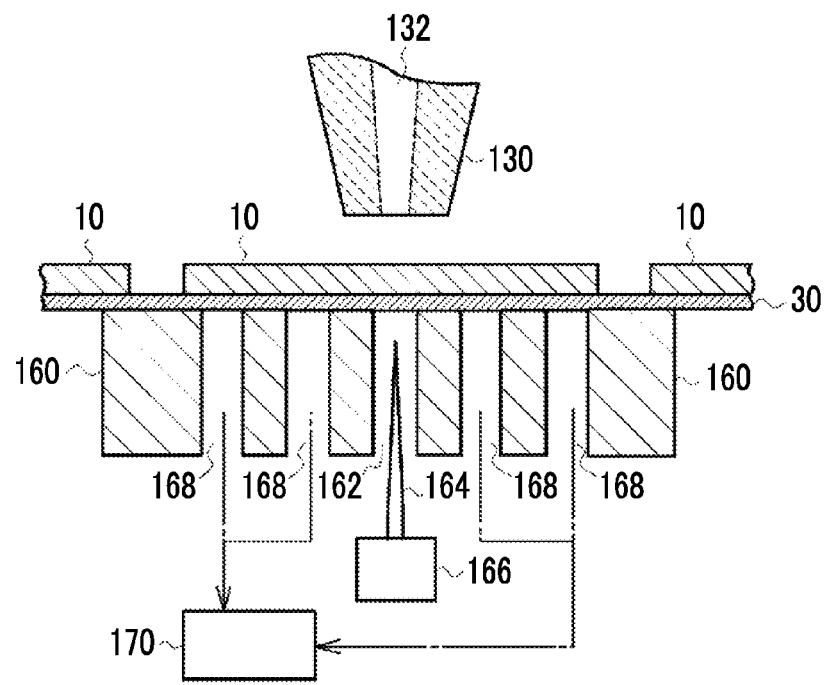
FIG. 1B is a schematic sectional view of FIG. 1A.
Figure 2A:
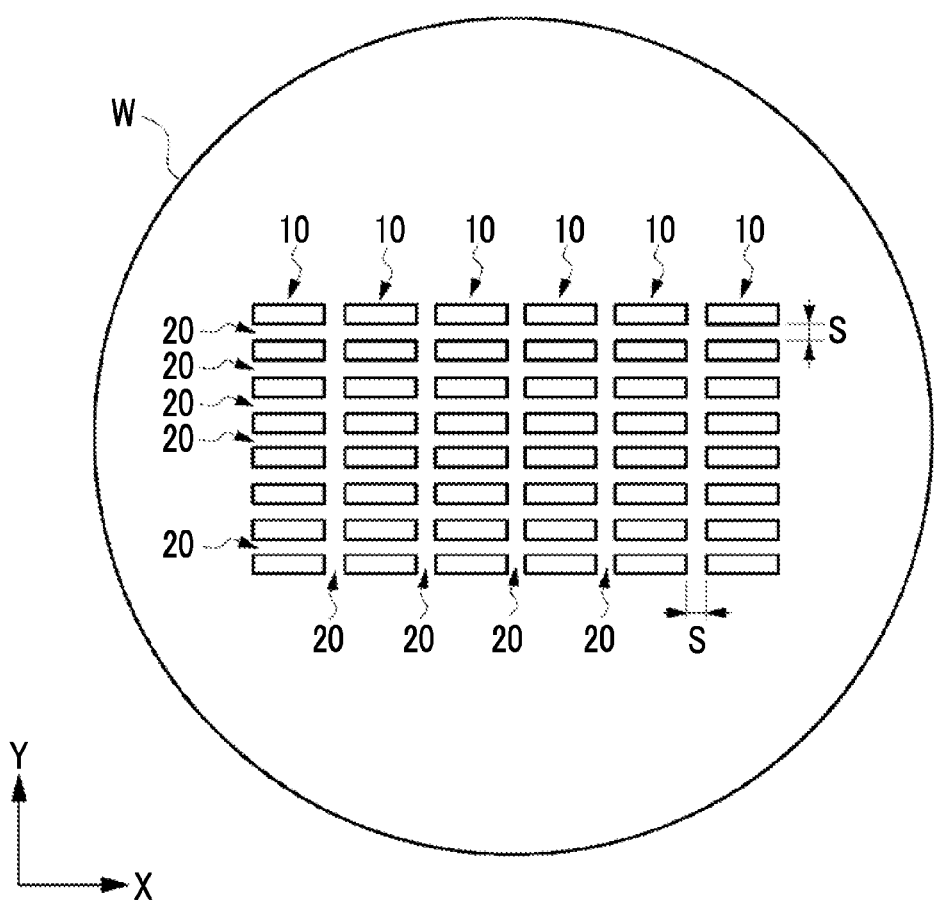
FIG. 2A is a schematic planar view of a semiconductor substrate.
Figure 2B:
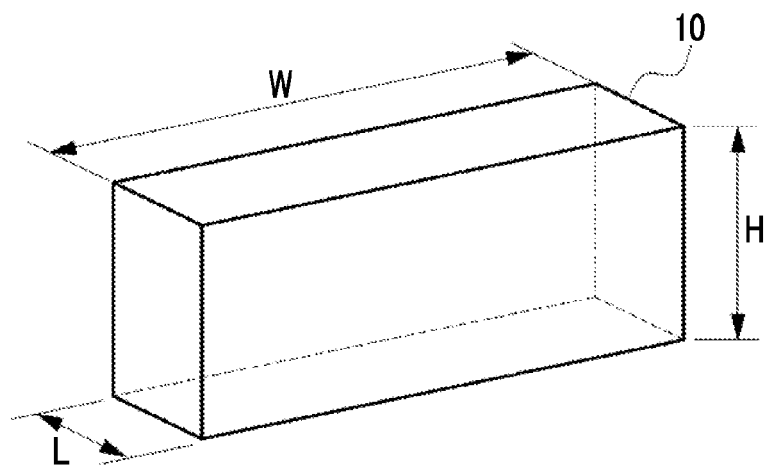
FIG. 2B is a schematic perspective view illustrating an example of a semiconductor chip.

FIG. 1A is a schematic perspective view which schematically illustrates a pickup device according to the first example of the present invention, FIG. 1B is a schematic sectional view thereof, FIG. 2A is a schematic top view of a semiconductor substrate on which elements are formed, and FIG. 2B is a schematic perspective view of one semiconductor chip.

As illustrated in FIG. 2A, multiple semiconductor chips 10 are formed on a front surface of a semiconductor substrate W in an array shape of a matrix configuration. Here, as an example, the semiconductor chip 10 having a rectangular shape in which a vertical and horizontal aspect ratio is great is illustrated, and the respective semiconductor chips 10 are separated in a grid pattern by cutting areas 20 which are defined by scribed lines or the like with an interval S. In general, one semiconductor chip has a rectangular shape with a length L in a depth direction, a width W, and a height H, but the width W is greater than the length L, and the height H is greater than the length L, as illustrated in FIG. 2B. Semiconductor chips with great aspect ratios are formed on a semiconductor substrate as multiple light emitting elements. However, a configuration of the semiconductor chip illustrated in FIGS. 2A and 2B is an example, and the semiconductor chip may have a rectangular shape with a great aspect ratio, or may have a square shape in which the length L is approximately the same as the width W.

For example, an ultraviolet-curable adhesive tape is attached to the rear surface of the semiconductor substrate W, the semiconductor substrate W is diced along the cutting areas 20 by a dicing device or the like, and divided into individual semiconductor chips. Thereafter, the adhesive tape is irradiated with ultraviolet, an adhesive layer is cured, and then the adhesive tape is expanded. In an expanding step, for example, the adhesive tape is mounted on a heated stage, the adhesive tape is expanded by pulling the adhesive tape in a two-dimensional direction, and thus, the interval S of the semiconductor chip 10 is expanded.

The adhesive tape in an expanded state is held by a holding member having a ring shape, and set to a stage of a pickup device. A pickup device 100 according to the present example includes a stage 110 on which an adhesive tape 30 to which the rear surface of the semiconductor chip 10 is attached is fixed by a holding member which holds the adhesive tape 30, a push-up device 120 which is positioned under the stage 110 and pushes the semiconductor chip upward through the adhesive tape, a collet 130 which is positioned over the stage 110 and adsorbs the front surface of the semiconductor chip that is pushed up, an upper image capturing camera 140 which captures an image of a front surface side of the semiconductor chip from an upper side of the stage 110, and a lower image capturing camera 150 which captures an image of a rear surface side of the semiconductor chip from a lower side of the stage 110, as illustrated in FIG. 1A.

The push-up device 120 is fixed in an X and Y plane, and the semiconductor chip 10 to be picked up is positioned on the push-up device 120 by moving the stage 110 in an X or Y direction. After the stage 110 is positioned, the push-up device 120 moves a push-up member, such as a needle, upward (in the Z direction), and lifts the adhesive tape 30 and the semiconductor chip 10. Accordingly, a part of the rear surface of the semiconductor chip 10 is peeled off from the adhesive tape 30. Meanwhile, the collet 130 is positioned immediately above the semiconductor chip 10, adsorbs the rear surface of the semiconductor chip 10, and is moved in the Z direction. Accordingly, the semiconductor chip 10 is picked up in the Z direction with the collet 130, and the semiconductor chip 10 is completely peeled off from the adhesive tape 30. The semiconductor chip adsorbed by the collet 130 is transported to a circuit substrate or a different position.

The push-up device 120 includes a cylindrical needle cap 160 having a flat front surface, and a circular via-hole 162 which extends in an axis direction is formed in approximately the center of the needle cap 160, as illustrated in FIG. 1B. A needle 164 is contained in the via-hole 162, and the needle 164 is moved up and down by a push-up drive device 166 in the Z direction. That is, when the semiconductor chip is picked up, the push-up drive device 166 raises the needle 164 such that the needle 164 protrudes from the front surface of the needle cap 160, and if pickup is completed, the push-up drive device 166 drops the needle 164 such that the needle 164 does not protrude from the front surface of the needle cap 160. In addition, multiple adsorbing holes 168 are formed around the via-hole 162. The adsorbing hole 168 is coupled to an adsorbing device 170 which generates negative pressure, and adsorbs the rear surface of the adhesive tape 30 positioned on the needle cap 160. Here, four circular adsorbing holes are illustrated, but the shape and the number of the adsorbing holes are not particularly limited.

Figure 3:
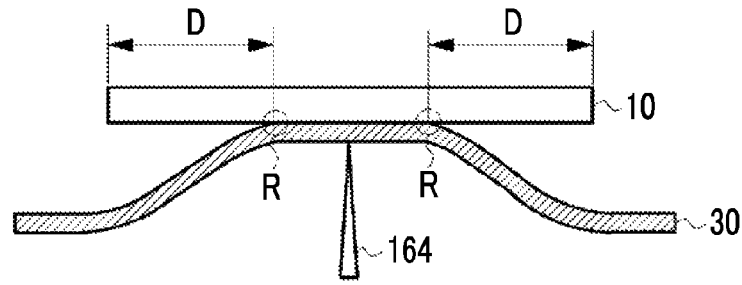
FIG. 3 is a diagram illustrating push-up of an adhesive tape which is performed by a push-up device.

FIG. 3 is a diagram illustrating an operation of the push-up device 120. If the semiconductor chip to be picked up is positioned on the push-up device 120, the rear surface of the adhesive tape 30 is adsorbed to the front surface of the needle cap 160 through the adsorbing hole 168, as illustrated in FIG. 1B. Subsequently, if the needle 164 is raised by the push-up drive device 166, the needle 164 makes the adhesive tape 30 and the semiconductor chip 10 thereon protrude, as illustrated in FIG. 3. Accordingly, the adhesive tape 30 is deformed in a convex manner around the needle 164, and the adhesive tape 30 is peeled off from the rear surface of the semiconductor chip 10 at a portion R from which slope starts. When the rear surface of the semiconductor chip 10 is peeled off from the adhesive tape 30, a distance in a width direction is referred to as the amount of peeling D.

Figure 4:
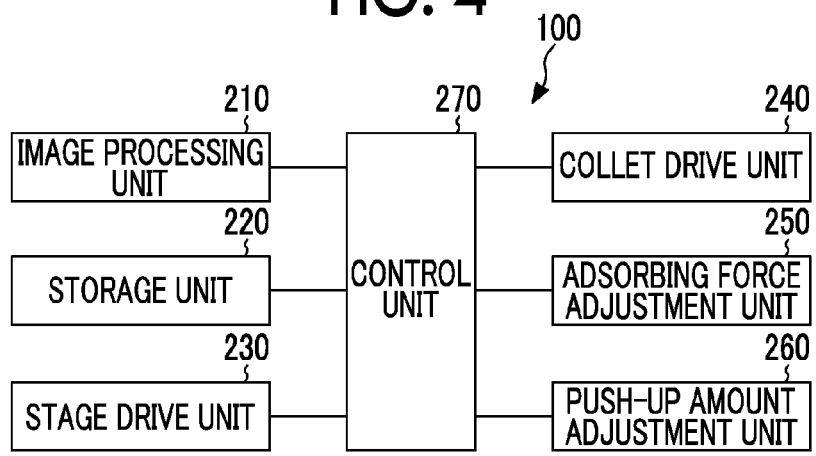
FIG. 4 is a block diagram illustrating an electrical configuration of a pickup device according to the first example of the present invention.

FIG. 4 is a block diagram illustrating an electrical configuration of the pickup device 100 according to the present example. The pickup device 100 receives image data from the upper image capturing camera 140 and the lower image capturing camera 150, and is configured to include an image processing unit 210 which performs image processing of the received image data, a storage unit 220 which stores data such as parameters for controlling an operation relevant to pickup, a stage drive unit 230 which moves the stage 110 in the X direction or the Y direction, a collet drive unit 240 which moves the collet 130 in the X direction, the Y direction, and the Z direction and controls adsorption of the collet 130, an adsorbing force adjustment unit 250 which adjusts adsorbing force of the adsorbing device 170 of the push-up device 120, a push-up amount adjustment unit 260 which adjusts the amount of push-up of the push-up drive device 166 of the push-up device 120, and a control unit 270 which controls each unit.

The image processing unit 210 recognizes the semiconductor chip 10 by analyzing the image data from the upper image capturing camera 140. For example, as illustrated in FIG. 2B, when an image of the semiconductor chip 10 is captured from an upper portion approximately and immediately above the semiconductor chip, the image processing unit 210 detects the contour of the semiconductor chip, that is, the contour of width W×length L, using an edge detection filter. The detected result is provided to the control unit 270, and the control unit 270 controls movement of the stage 110 based on the detected result.

Furthermore, the image processing unit 210 analyzes an adhesive state of the rear surface of the semiconductor chip 10 and the adhesive tape 30 by analyzing image data from the lower image capturing camera 150. The rear surface of the semiconductor chip is held by the adhesive tape 30 through an adhesive layer or a sticking layer, but an adhesive state of the rear surface of the semiconductor chip depends upon the respective semiconductor chips. As described above, if an expanding step in which the interval S of the semiconductor chip 10 is expanded is performed before a pickup step, the adhesive tape is expanded in the X and Y directions, and as a result, a part of the rear surface of the semiconductor chip 10 is peeled off from the adhesive tape 30. It is preferable that all the semiconductor chips are uniformly peeled off, but peeled states, that is, adhesive states of the semiconductor chips, differ from each other. In the present example, the lower image capturing camera 150 captures an image of the rear surface side of the semiconductor substrate W, and the adhesive state of the semiconductor chip is detected from the image data.

Figure 5:
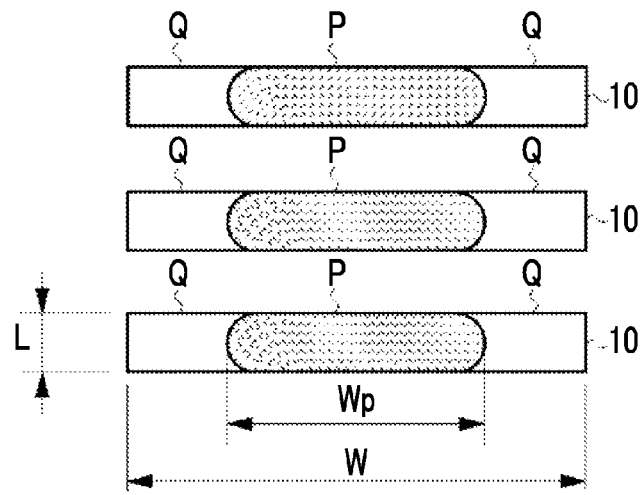
FIG. 5 is a diagram schematically illustrating an adhesive state and a peeled state of a rear surface of the semiconductor chip when viewed from the rear surface of the semiconductor substrate.

FIG. 5 schematically illustrates an adhesive state of the rear surface of the semiconductor chip 10 after the expanding step. If the rear surface of the semiconductor chip across the adhesive tape is viewed from the rear surface side of the semiconductor substrate W, there is a difference of darkness and lightness, or a difference of color tone between an adhesive area P to which the rear surface of the semiconductor chip 10 adheres by the adhesive tape 30, and a peeled area Q which is peeled off from the adhesive tape 30. The adhesive tape 30 includes an adhesive layer and a light-transmissive base material, has a dark color if the rear surface of the semiconductor chip adheres to the adhesive tape by the adhesive layer, and had a light color if the rear surface of the semiconductor chip is peeled off from the adhesive tape. If the adhesive tape 30 is expanded, the semiconductor chip 10 is in a state in which both end portions of the rear surface thereof are peeled off and the central portion between both end portions adheres to the adhesive tape, but an adhesive width Wp of the adhesive area P may not be uniform depending on the semiconductor chips.

The image processing unit 210 analyzes image data from the lower image capturing camera 150, and provides the analysis result to the control unit 270. The control unit 270 detects an adhesive state of the semiconductor chip based on the analysis result, and controls the pickup operation based on the detected result, as will be described below.

The storage unit 220 stores parameters for controlling the pickup operation of the semiconductor chip. As an example, corresponding relationships between adhesive states of the semiconductor chips and optimal parameters are confirmed in advance by experiment or simulation, and the relationships are stored in the storage unit 220. The relationships between the adhesive states and the optimal parameters which are stored in the storage unit 220 are referred to as optimal parameter information for the sake of convenience. In the present example, the amount of push-up of the needle, adsorbing force of the adsorbing device 170, and a time interval up to the pickup of the next semiconductor chip are used as the parameters for controlling the pickup of the semiconductor chip.

An example of the optimal parameter information will be described. Here, an adhesive area is used as an adhesive state of the semiconductor chip, but the adhesive state may be referred to as index other than this, and for example, may be the adhesive width Wp illustrated in FIG. 5. The adhesive area is approximately a size (adhesive width Wp×length L) of the adhesive area P. An example in which parameters for control are set to the amount of push-up of the needle will be described. The larger the adhesive area is, the greater the amount of push-up of the needle 164 is, and the smaller the adhesive area is, the less the amount of push-up of the needle 164 is. If the adhesive area is large, adhesive strength increases, and thus, it is difficult for the rear surface of the semiconductor chip to be peeled off from the adhesive tape. For this reason, the amount of push-up of the needle increases.

An example in which the parameters for control are set to the adsorbing force of the adsorbing device 170 will be described. The larger the adhesive area is, the greater the adsorbing force is, and the smaller the adhesive area is, the less the adsorbing force is. If the adhesive area is large, it is difficult for the rear surface of the semiconductor chip to be peeled off from the adhesive tape. For this reason, the adsorbing force of the adhesive tape 30 is increased by the adsorbing device 170, and thus, peeling is expedited.

An example in which the parameters for control are set to the time interval up to the pickup of the next semiconductor chip will be described. The larger the adhesive area is, the shorter time interval is, and the smaller the adhesive area is, the longer the time interval is. If the adhesive area is large, the adhesive force increases, and the time when a next adjacent semiconductor chip returns to an original posture thereof after the semiconductor chip is picked up is shortened. In contrast to this, if the adhesive area is small, the time when a subsequent adjacent semiconductor chip returns to an original posture thereof is lengthened. If the posture of the semiconductor chip becomes bad, image recognition of the upper image capturing camera 140 may not be performed normally, and thus, a control of the optimal time interval according to the adhesive state is required. A relationship between the adhesive state and the parameters will be described below.

The stage drive unit 230 moves the stage 110 in the X direction and Y direction such that the semiconductor chip to be picked up next is positioned to the push-up device 120, based on the image analysis result of the image data of the upper image capturing camera 140.

When the semiconductor chip is picked up, the collet drive unit 240 positions the collet 130 in an immediately upward direction of the push-up device 120, and adsorbs the front surface of the semiconductor chip through an adsorbing hole 132 of the collet 130. In addition, the collet drive unit 240 moves the collet 130 which adsorbs the semiconductor chip to a positioned place, and releases the semiconductor chip by stopping the adsorption.

The adsorbing force adjustment unit 250 adjusts adsorbing force of the adsorbing device 170. The adsorbing device 170 adsorbs the rear surface of the adhesive tape 30 using a constant adsorbing force which is created by predetermined negative pressure and is transferred through the adsorbing hole 168. In addition, the adsorbing force adjustment unit 250 varies the adsorbing force of the adsorbing device 170 according to parameters which are determined by the control unit 270.

The push-up amount adjustment unit 260 adjusts the amount of push-up of the needle which is performed by the push-up drive device 166. The push-up drive device 166 pushes up the needle 164 by the predetermined amount of push-up, thereby peeling off a part of the rear surface of the semiconductor chip from the adhesive tape 30. In addition, the push-up amount adjustment unit 260 varies the amount of push-up of the push-up drive device 166 according to the parameters determined by the control unit 270.

Figure 6:
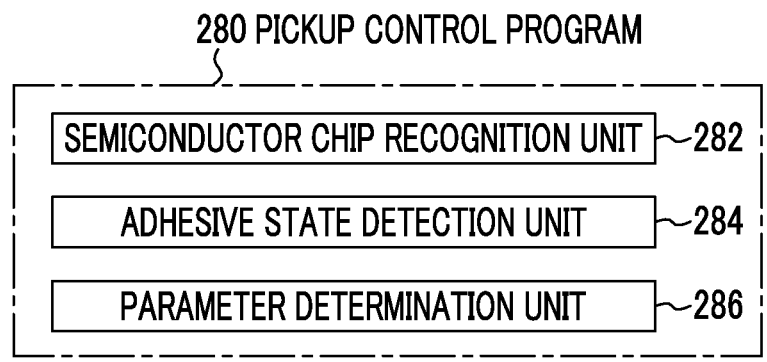
FIG. 6 is a block diagram illustrating a functional configuration of a pickup control program according to the first example of the present invention.

The control unit 270 controls an operation of each unit of the pickup device 100. The control unit 270 includes, for example, a microcontroller, a microprocessor, or a ROM/RAM, and controls the pickup device by executing, for example, a program stored in the ROM/RAM. In the present example, the control unit 270 includes a pickup control program for controlling each unit of the pickup device. FIG. 6 illustrates a functional block diagram of the pickup control program. As illustrated in FIG. 6, a pickup control program 280 includes a semiconductor chip recognition unit 282, an adhesive state detection unit 284, and a parameter determination unit 286.

The semiconductor chip recognition unit 282 recognizes a semiconductor chip to be picked up next based on the contour information of the semiconductor chip which is the analysis result of the image data of the upper image capturing camera 140 that is processed by the image processing unit 210. The semiconductor chip recognition unit 282 controls the stage drive unit 230 based on the recognized result, and moves the stage 110 in the X direction and the Y direction, such that a semiconductor chip to be picked up next is positioned in the push-up device 120.

The adhesive state detection unit 284 detects the adhesive state of the semiconductor chip based on the analysis result of the image data of the lower image capturing camera 150 which is processed by the image processing unit 210. The adhesive state of the rear surface of the semiconductor chip is, for example, an adhesive state of the adhesive area P illustrated in FIG. 5, and here, an adhesive area Sp or the adhesive width Wp is detected as an index indicating the adhesive state. Edge detection filtering is performed as an example of a method of detecting the adhesive area Sp or the adhesive width Wp, thereby extracting the contour of the rear surface of the semiconductor chip from the image data. For example, when one pixel is configured by n bits, one piece of image data is represented by gradation data of $2^n$ pieces. As illustrated in FIG. 5, a difference between darkness and lightness is represented in the adhesive area P and the peeled area Q, and thus, image data is compared with a threshold which defines constant darkness, the number of pixels with a value higher than or equal to the threshold, that is, the number of dark pixels which are included in the image data is counted, and the sum of the counted pixels is referred to as the adhesive area Sp. At this time, the sum of pixels in consecutive areas in which the pixels with a value higher than or equal to the threshold are more than or equal to the number of predetermined pixels, may be determined to be the adhesive area Sp.

In addition, if the adhesive width Wp is detected, for example, the number of consecutive pixels in a width direction may be detected as the adhesive width Wp based on the position information of a pixel group which is detected as the adhesive area Sp. In this case, the adhesive width Wp may be a width of an angle of any one of a lateral direction, a vertical direction, and an oblique direction, with respect to the adhesive area P, and in addition, it is not necessary for a an adhesive width to be determined to be as a maximum width. That is, in an angle at which a relationship between a magnitude of adhesive force and the size of the adhesive area Sp is established, a width of an arbitrary angle may be determined to be the adhesive width Wp.

The parameter determination unit 286 determines optimal parameters for controlling pickup of the semiconductor chip based on the detected result of the adhesive state detection unit 284. In the present example, the parameters for controlling the pickup are the adsorbing force of the adsorbing device 170, the amount of push-up of the needle of the push-up drive device 166, and the time interval up to the image processing of the next semiconductor chip which is performed by the upper image capturing camera 140. The adjustment of the time interval may be performed at any timing, and for example, start time of the image processing of the image processing unit 210, moving time of the stage 110 of the stage drive unit 230, or the like may be managed by a timer. The parameter determination unit 286 reads the optimal parameter information from the storage unit 220 in response to the detected result of adhesive state performed by the adhesive state detection unit 284, compares the detected adhesive state with the optimal parameter information, and determines optimal parameters according to the detected adhesive state. The parameters determined by the parameter determination unit 286 are provided to the adsorbing force adjustment unit 250 and the push-up amount adjustment unit 260. The adsorbing force adjustment unit 250 varies the adsorbing force according to the determined parameters. The push-up amount adjustment unit 260 varies the amount of push-up according to the determined parameters.

Next, an operation of the pickup device according to the present example will be described. Failure in the pickup step is generated by a phenomenon in which the semiconductor chip may not be recognized in the image data of the upper image capturing camera 140 due to the tilted posture of the semiconductor chip, a phenomenon in which two adjacent semiconductor chips are simultaneously picked up (two pieces are taken), or the like. A mechanism which is the cause of occurrence of the phenomenon results from the amount of peeling D (refer to FIG. 3) of the semiconductor chip from the adhesive tape, or the posture of the semiconductor chip. If the amount of peeling D is great, the posture of the semiconductor chip is collapsed and is failed of being picked up or may not be recognized by the image data, and two semiconductor chips adjacent to each other are drawn and taken by the collet. In contrast to this, if the amount of peeling D is small, the rear surface of the semiconductor chip is not peeled off from the adhesive tape, and pickup failure occurs.

Figure 7A:
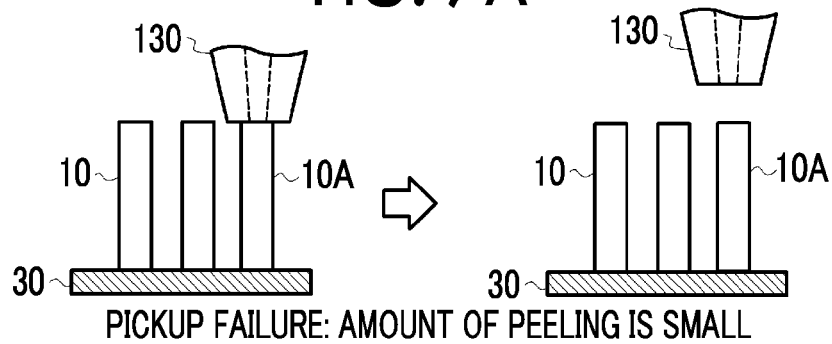
FIGS. 7A, 7B, 7C and 7D are diagrams illustrating a phenomenon in which a failure occurs in a pickup step.
Figure 7B:
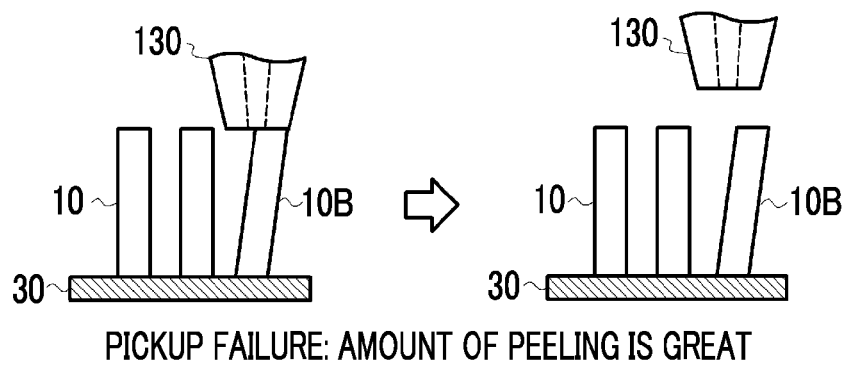
Figure 7C:
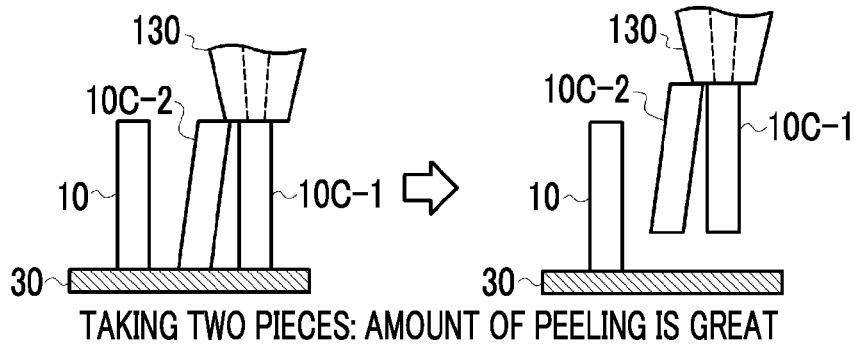
Figure 7D:
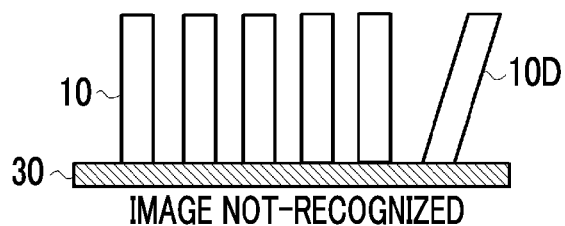

FIG. 7A illustrates an example in which the semiconductor chip is failed of being picked up by the collet 130, in a case in which the amount of peeling D of the semiconductor chip is small. If the amount of peeling D is small, the adhesive area increases, adhesive strength between the rear surface of a semiconductor chip 10A and the adsorbing force of the adhesive tape 30 is greater than the adsorbing force of the collet 130, and thereby pickup failure of the semiconductor chip 10A occurs. FIG. 7B illustrates an example in which a semiconductor chip 10B is failed of being picked up by the collet 130, in a case in which the amount of peeling D of the semiconductor chip 10B is great. Since the amount of peeling D is great, the adhesive strength decreases. If the posture of the semiconductor chip 10B is tilted due to this reason, the front surface of the semiconductor chip 10B may not be adsorbed by the collet 130 when the semiconductor chip 10B is pushed up by the needle, and thus, pickup failure occurs. FIG. 7C illustrates an example in which two semiconductor chips are taken by the collet 130. If the amount of peeling D of a semiconductor chip 10C-2 is great and the posture thereof is slightly tilted toward a semiconductor chip 10C-1, the two semiconductor chips 10C-1 and 10C-2 are simultaneously picked up by the collet 130. FIG. 7D illustrates an example in which, when the amount of peeling D of a semiconductor chip 10D is great, the posture of the semiconductor chip 10D is tilted, and thereby the semiconductor chip 10D may not be recognized in the image data of the upper image capturing camera 140. Particularly, the tilt of the posture of the semiconductor chip 10D is easily produced by an impact or the like when the semiconductor chips adjacent to each other are picked up, that is, when the semiconductor chips adjacent to each other and the adhesive tape are pushed up by the needle. In addition, as illustrated in FIGS. 7B to 7D, tilt of the semiconductor chip is easily produced in a semiconductor chip having a shape with a height greater than a width or a length, and the greater the height with respect to the width or the length is, the more the tilt easily increases.

The semiconductor chip which is determined to undergo to pickup failure in the pickup step has to be wasted, and thus, the yield is inevitably reduced. For this reason, in order to increase the yield, it is very desirable to reduce the failure rate of the pickup step.

The failure rate of the pickup step of the related art depends upon wafers, and depends upon the semiconductor chips of the wafer, in the steps of manufacturing the semiconductor chips having the same specification. One of the reasons for this is that even though the adhesive states of the rear surfaces of the semiconductor chips after expanding are different from each other depending upon the wafers, and are different even within the wafer surface, the pickup is performed with the same pickup condition in both situations. That is, pickup conditions do not correspond to variations of the adhesive states of the wafers or within the wafer. Meanwhile, even if the pickup conditions correspond to the variations of the adhesive states, the number of steps increases in order to adjust the pickup conditions, and thus, changing the pickup conditions is very complicated, and at the same time, adjustment thereof depends upon the experience of an operator. According to the above-described situation, as optimal pickup conditions are automatically applied to the semiconductor chips having different adhesive states from each other, the yield increases, and the number of adjustment steps for a change of pickup conditions and influence of the difference in skill level between operators are reduced. Hence, in the pickup device according to the present example, parameters for adjusting the pickup conditions are automatically changed in accordance with the adhesive state of the semiconductor chip.

Figure 8:
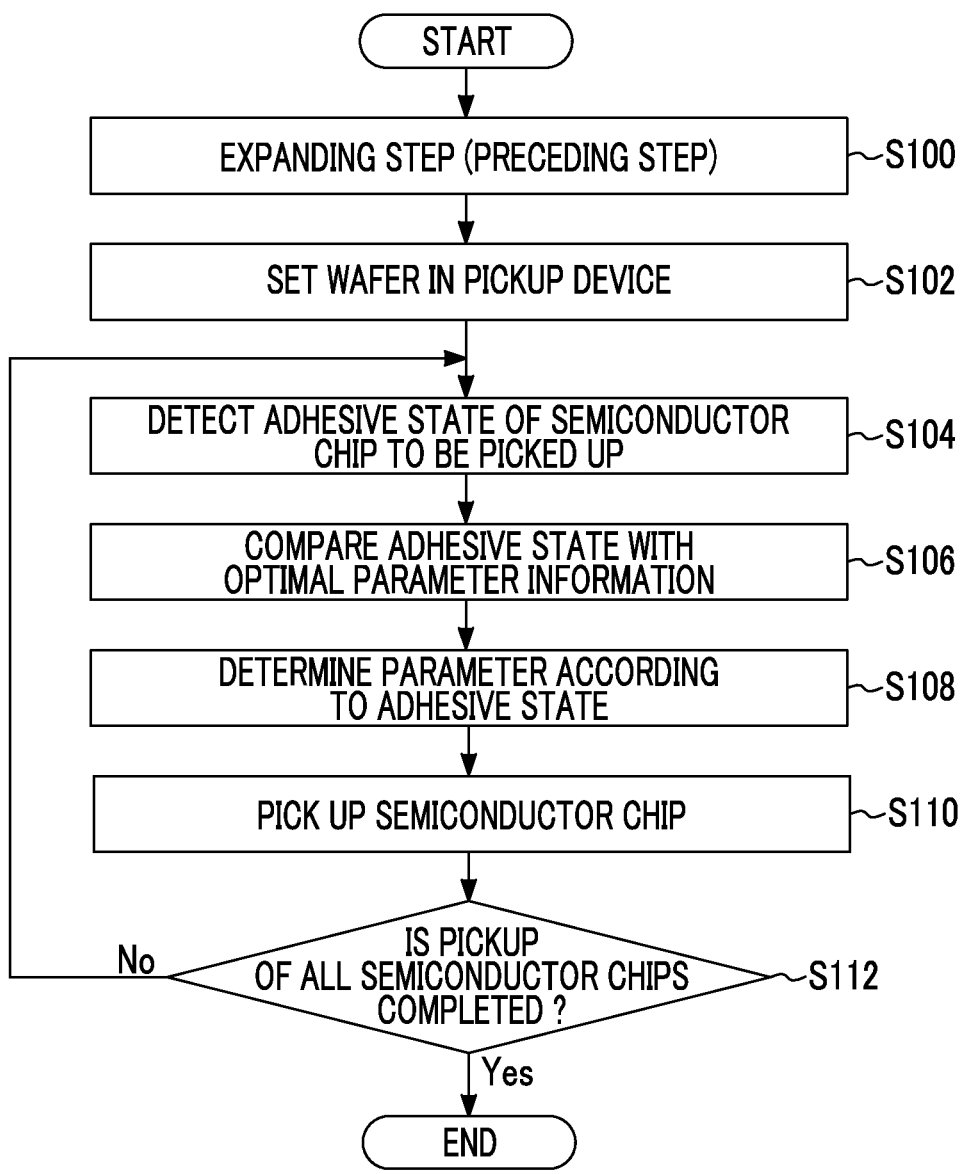
FIG. 8 is a flowchart illustrating a first method of changing pickup conditions of a pickup device according to a first example of the present invention.

FIG. 8 is a flowchart illustrating a first method of automatically changing the pickup conditions of the pickup device according to the present example. If the expanding step which is a preceding step is completed (S100), an adhesive tape that is adhered to by the semiconductor substrate in which the intervals between the semiconductor chips are expanded is held by a holding member having a ring shape, the holding member is set on the stage 110 of the pickup device 100 (S102), and the pickup operation starts under a control of the control unit 270.

If the holding member including the semiconductor substrate is set on the stage 110, an image of the semiconductor substrate is captured by the upper image capturing camera 140 and the lower image capturing camera 150 from a lower side and an upper side of the stage 110, respectively, and image processing of the image data is performed by the image processing unit 210. The semiconductor chip recognition unit 282 recognizes a semiconductor chip to be picked up next based on the analysis result of the image processing unit 210, the stage 110 moves in accordance with the recognized result, and the semiconductor chip is positioned in the push-up device 120. In addition, the adhesive state detection unit 284 detects an adhesive state between the rear surface of the semiconductor chip and the adhesive tape based on the analysis result of the image processing unit 210 (S104). Here, the adhesive state detection unit 284 detects the adhesive state of the semiconductor chip to be picked up after being recognized by the semiconductor chip recognition unit 282. The parameter determination unit 286 compares the adhesive state detected by the adhesive state detection unit 284 with the optimal parameter information read from the storage unit 220 (S106), and determines optimal parameters according to the detected adhesive state (S108). For example, in a case in which the amount of push-up is adjusted as the parameter, the parameter determination unit 286 selects an adhesive area which coincides with or is nearest to the detected adhesive area Wp from the optimal parameter information, and determines the amount of push-up corresponding to the selected adhesive area. Alternatively, in a case in which adsorbing force is adjusted as the parameter, the parameter determination unit 286 determines the adsorbing force corresponding to the adhesive area which coincides with or is nearest to the adhesive area Wp. Alternatively, in a case in which a time interval is adjusted as the parameter, the parameter determination unit 286 determines the time interval corresponding to the adhesive area which coincides with or is nearest to the adhesive area Wp. The parameter determination unit 286 may determine not only one parameter, but also two or three parameters simultaneously. That is, each parameter between the amount of push-up and the adsorbing force may be determined, each parameter between the amount of push-up and the time interval may be determined, each parameter between the adsorbing force and the time interval may be determined, or three parameters between the amount of push-up, the adsorbing force, and the time interval may be determined simultaneously.

If the parameters are determined by the parameter determination unit 286, the pickup of the semiconductor chip is performed by the amount of push-up, the adsorbing force, or the time interval which are adjusted in accordance with the parameters (S110). Subsequently, it is determined whether or not the pickup of all the semiconductor chips in the semiconductor substrate is completed (S112). If there is the semiconductor chip which is not picked up, the operation from step S104 is repeated, and when the pickup of all the semiconductor chips in the semiconductor substrate is completed, the flow is terminated.

Figure 9:
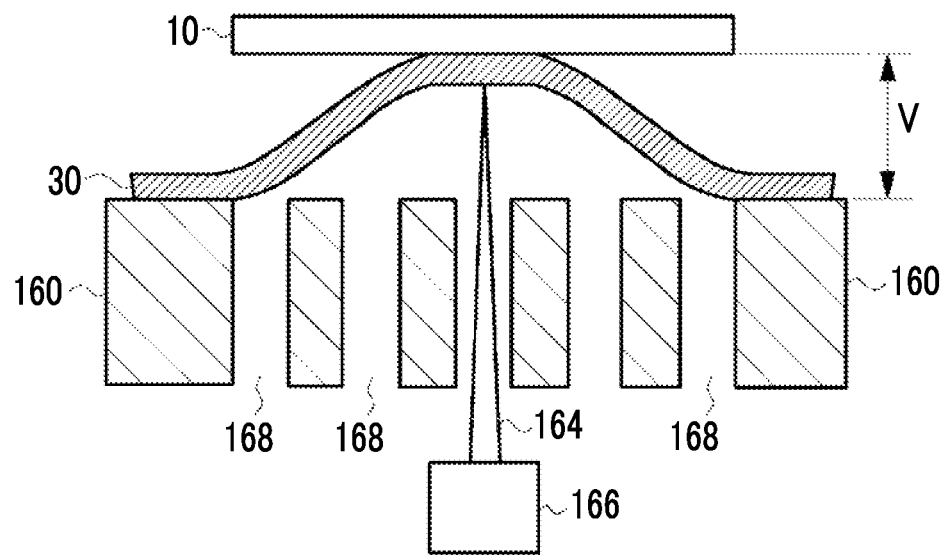
FIG. 9 is a diagram illustrating pickup when the amount of push-up of a needle is adjusted.

Next, each parameter will be described. FIG. 9 is a diagram illustrating pickup when the amount of push-up of the needle is adjusted. As illustrated in FIG. 9, the push-up drive device 166 varies the amount of push-up V of the needle 164 which protrudes from the front surface of the needle cap 160 in accordance with the parameter determined by the parameter determination unit 286. That is, when the adhesive area of the rear surface of the semiconductor chip is great, the amount of push-up V increases, and in contrast to this, when the adhesive area is small, the amount of push-up V decreases. Accordingly, the amount of peeling D is controlled in accordance with the adhesive area. As a result, the failure illustrated in FIGS. 7A to 7D is reduced.

Figure 10:
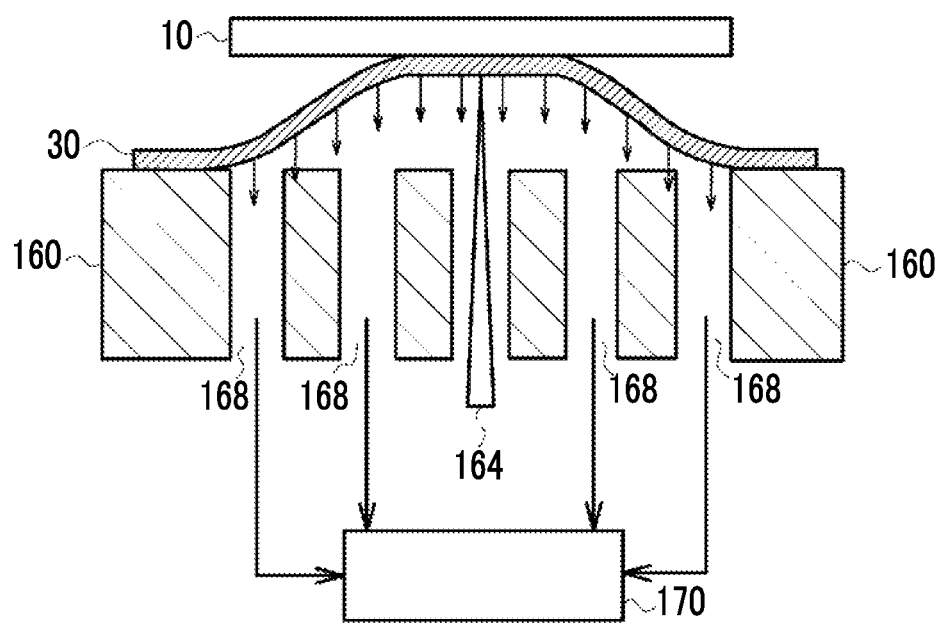
FIG. 10 is a diagram illustrating pickup when an adsorption force of the push-up device is adjusted.

FIG. 10 is a diagram illustrating pickup when the adsorbing force of the push-up device is adjusted. As illustrated in FIG. 10, the adsorbing device 170 varies the adsorbing force which adsorbs the rear surface of the adhesive tape 30 from the adsorbing hole 168 in accordance with the parameter determined by the parameter determination unit 286. That is, when the adhesive area of the rear surface of the semiconductor chip is great, the adsorbing force increases, and in contrast to this, when the adhesive area is small, the adsorbing force decreases. Accordingly, the adsorbing force which pulls the adhesive tape 30 in a direction of peeling is varied, and the amount of peeling D is controlled in accordance with the adhesive area.

Figure 11A:
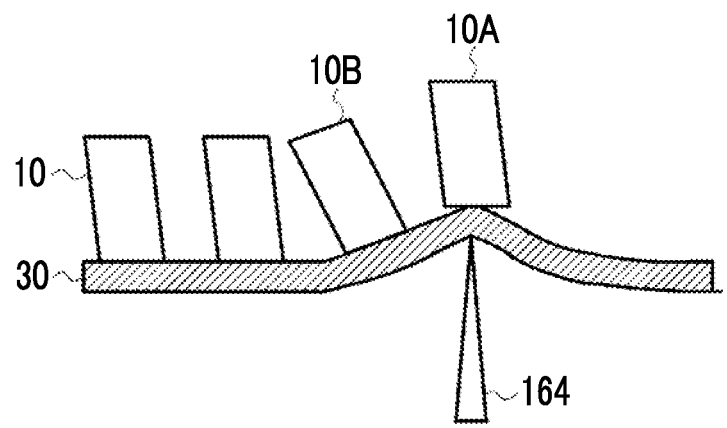
FIGS. 11A, 11B and 11C are diagrams illustrating pickup when a time interval is adjusted.
Figure 11B:
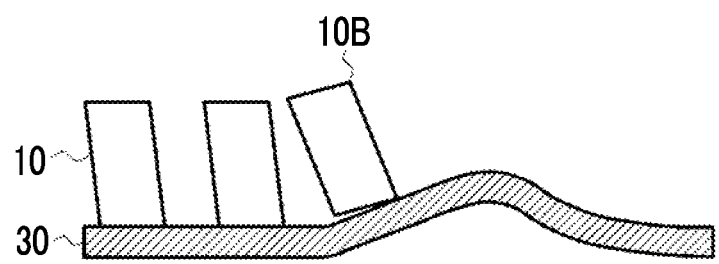
Figure 11C:
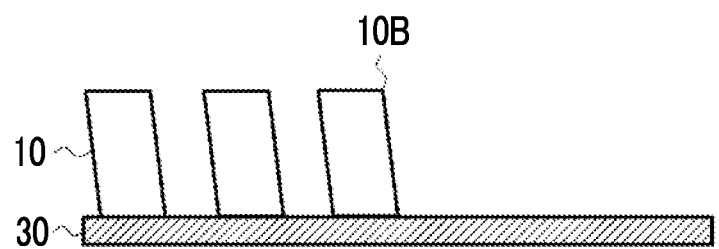

FIGS. 11A to 11C are diagrams illustrating pickup when the time interval is adjusted. First, in FIG. 11A, when the semiconductor chip 10A is picked up, the semiconductor chip 10A and the adhesive tape 30 are pushed up by the needle 164. At this time, the adhesive tape 30 is formed in a convex shape, and thus, the semiconductor chip 10B adjacent to the semiconductor chip 10A is tilted. Immediately after the pickup of the semiconductor chip 10A is completed, the adhesive tape 30 starts to return to an original state as illustrated in FIG. 11B, and when a predetermined amount of time passes, the adhesive tape completely returns to the original state, as illustrated in FIG. 11C. When the adhesive area of the semiconductor chip 10B is small, the adhesive strength is weakened, and time is taken until the posture of the semiconductor chip 10B returns to the original state. However, if the adhesive area of the semiconductor chip 10B is large, the time which is taken until the posture of the semiconductor chip 10B returns to the original state is shortened. If the posture of the semiconductor chip 10B is bad, the semiconductor chip 10B may not be correctly recognized by the upper image capturing camera 140, or the semiconductor chip 10B may not be correctly positioned, and thereby, there is a possibility that the semiconductor chip 10B may not be adsorbed by the collet 130. For this reason, the time interval is adjusted in accordance with the adhesive area of the semiconductor chip. The time interval is a period from a time when the semiconductor chip 10A is pushed up to a time when image recognition of the next semiconductor chip 10B is performed, and the time may be adjusted at any section of the period. In addition, in a case in which the parameter of the time interval is determined, it is necessary to detect the adhesive state of the semiconductor chip 10B adjacent to the semiconductor chip 10A. Hence, the adhesive state detection unit 284 detects simultaneously the adhesive state of the semiconductor chip 10A to be picked up, and the adhesive state of the next semiconductor chip 10B adjacent to the semiconductor chip 10A, but may regard the adhesive state of the semiconductor chip 10A as the adhesive state of the semiconductor chip 10B.

The adhesive states of each semiconductor chip are detected by using the above-described method, the parameters are changed in accordance with the detected adhesive states, and thus, if the number of semiconductor chips within the semiconductor substrate is great, time is taken until the pickup is completed. In contrast to this, even if variation exists in the adhesive state of the semiconductor chip within the semiconductor substrate, the pickup operation corresponding to each adhesive state is performed, and thus, the failure of the pickup step is reduced.

Figure 12:
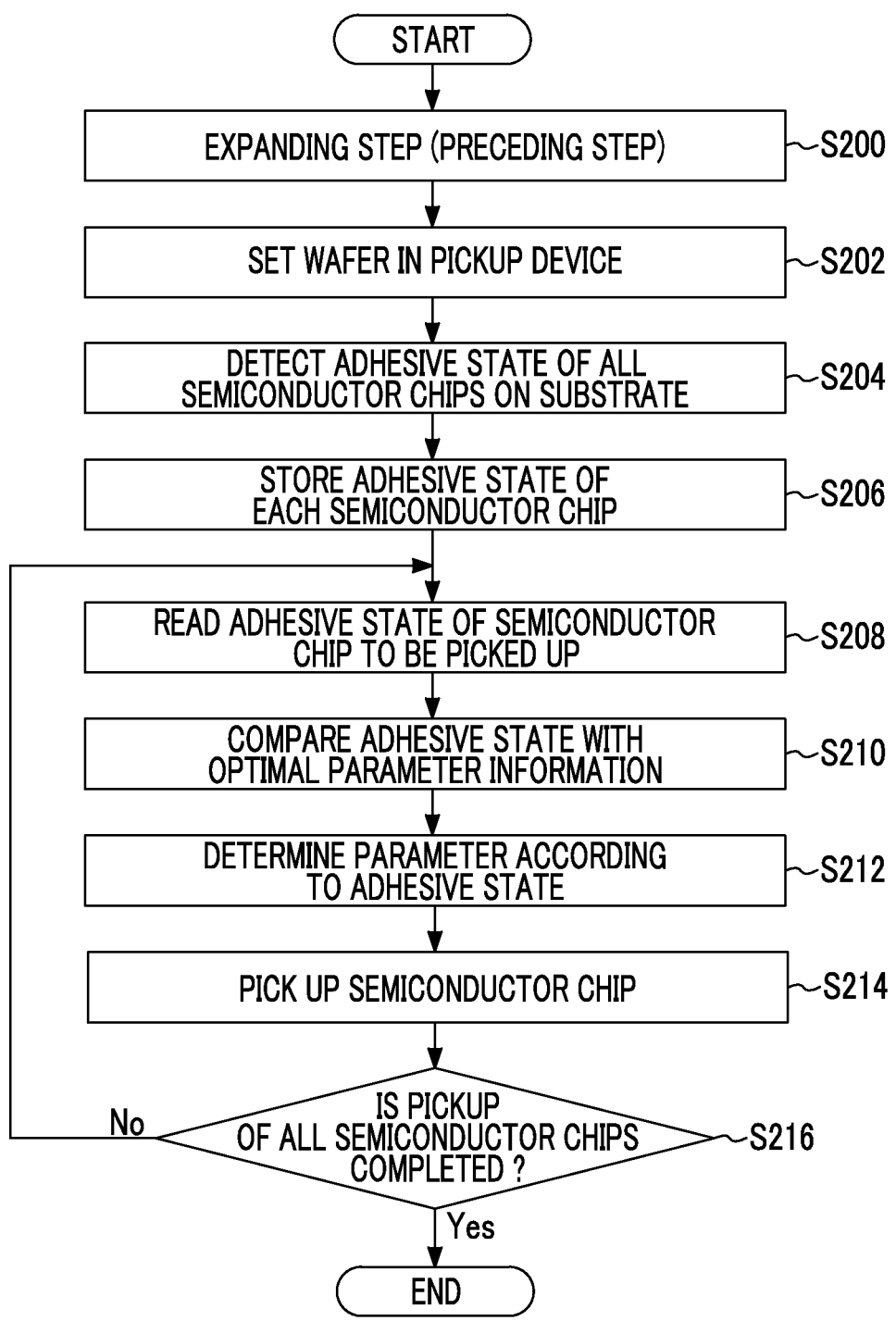
FIG. 12 is a flowchart illustrating a second method of changing the pickup conditions of the pickup device according to the first example of the present invention.

FIG. 12 illustrates a second method of automatically changing the pickup conditions of the pickup device according to the present example. An example in which, while the adhesive state of the semiconductor chip which is picked up is detected, the parameters are changed as the first method. However, in the second method, the adhesive state of the semiconductor chip is detected, and thereafter, when the semiconductor chip is picked up, the parameters are changed in accordance with the adhesive state of the semiconductor chip. If the expanding step is completed (S200), the holding member which holds the semiconductor substrate and the adhesive tape is set in the stage of the pickup device (S202). Subsequently, the control unit 270 detects the adhesive states of all the semiconductor chips within the semiconductor substrate, as preprocessing of the pickup. First, the lower image capturing camera 150 captures an image of the entire rear surface of the semiconductor substrate from the lower side of the stage 110, and the image data is analyzed by the image processing unit 210. The adhesive state detection unit 284 detects the adhesive states of all the semiconductor chips within the semiconductor substrate based on the analysis result from the image processing unit 210 (S204). The detected adhesive states are stored in the storage unit 220 in association with each semiconductor chip (S206). Subsequently, the pickup of the semiconductor chip starts, if the preprocessing is completed. If the semiconductor chip which is picked up by the semiconductor chip recognition unit 282 is recognized, the adhesive state detection unit 284 reads the adhesive state corresponding to the recognized semiconductor chip from the storage unit 220 (S208), compares the adhesive state with the optimal parameter information (S210), and then the parameters according to the adhesive state are determined (S212) and the pickup of the semiconductor chip is performed in accordance with the parameters (S214). Thereafter, processing from step S208 to step S214 is repeated until the pickup of all the semiconductor chips within the semiconductor substrate is completed.

In this way, according to the second method, the adhesive states of each semiconductor chip on the semiconductor substrate are detected in advance as the preprocessing, and thus, the time required for the pickup operation is shortened. In the same manner as in the second method, if the adhesive state of the semiconductor chip is detected in advance, step S204 may be performed earlier than step S202. That is, before the holding member which holds the semiconductor substrate and the adhesive tape is set in the pickup device, the rear surface side of the semiconductor substrate is observed by the image capturing camera, and the adhesive states of each semiconductor chip may be detected.

Next, a third method will be described. According to the first and second methods, the adhesive states of each semiconductor chip are detected, and the parameters of each semiconductor chip are changed, but according to the third method, the adhesive states of the semiconductor chips are detected in a semiconductor substrate unit, and the parameters are changed in a semiconductor substrate unit. If the adhesive state of the semiconductor chip is detected in a semiconductor substrate unit, a representative one semiconductor substrate or multiple semiconductor chips are selected, and the adhesive state of the selected semiconductor chip is set to the adhesive state of the semiconductor substrate. In the same manner as in the second method, even in the third method, the adhesive state is detected in advance in a semiconductor substrate unit for being stored in the storage unit 220, and the adhesive state of the corresponding substrate may be read from the storage unit 220, when the pickup of a substrate which is a target is performed.

Figure 13A:
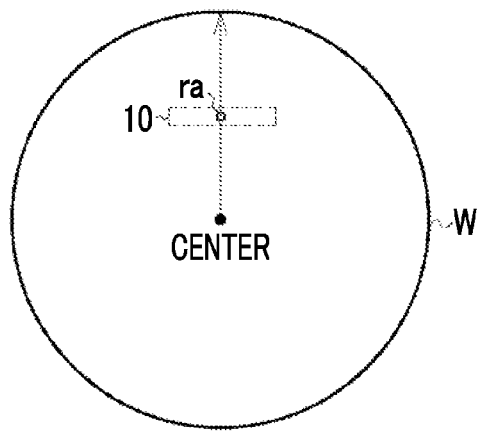
FIGS. 13A and 13B are diagrams illustrating a third method of detecting an adhesive state in a substrate unit according to the first example of the present invention.

Next, a method of detecting the adhesive state in a substrate unit will be described. In FIG. 13A, the adhesive state of the semiconductor chip which is positioned in a radial direction of the semiconductor substrate is set to the adhesive state in a substrate unit. For example, the adhesive state of a semiconductor chip 10a which is positioned in an approximately central point ra in a radial direction is detected, and the detected adhesive state is set to the adhesive state of the substrate. The reason is that, when the adhesive tape is expanded in the expanding step, stretching of the adhesive tape is not necessarily uniform, and a peripheral portion may be stretched more greatly than a central portion. As a result, the adhesive area of the semiconductor chip in the peripheral portion easily becomes smaller than that in the central portion. Accordingly, by detecting the adhesive state of the semiconductor chip 10a of the central point ra in the radial direction, it is possible to detect an average adhesive state of the central portion and the peripheral portion.

Figure 13B:
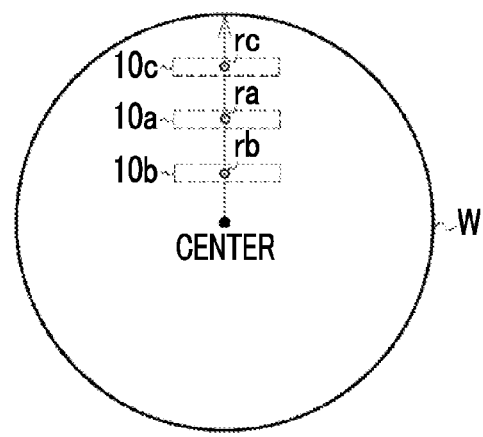

In addition, the adhesive states of multiple semiconductor chips within the substrate are detected, and the adhesive state in a substrate unit may be obtained from the detected result. For example, the adhesive states of multiple semiconductor chips which are positioned in one radial direction are detected, the adhesive states of the multiple semiconductor chips which are positioned in multiple radial directions are detected, or the adhesive states of semiconductor chips which are positioned in random multiple places on the substrate are detected, and an average adhesive state of the detected result is calculated. In FIG. 13B, adhesive states of semiconductor chips 10a, 10b, and 10c of three points ra, rb, and rc in a radial direction are detected, and an adhesive state of a substrate unit is calculated from the detected result. The "average" in the present specification may be not only a simple arithmetic average of the detected adhesive states, but also values included in a third of the center of values which are obtained by trisecting a range between a maximum value and a minimum value in the detected values, and may be other detected values except for the maximum value and the minimum value in the detected values.

According to the third method, when there is a difference between adhesive states of semiconductor chips on semiconductor substrates, parameters are changed in a semiconductor substrate unit in accordance with an adhesive state, and thus, failure of pickup is reduced in a substrate unit. In addition, a change of the parameters is performed only once per one semiconductor substrate unlike the first and second methods, and thus, time required for pickup of one semiconductor substrate is shortened.

Figure 14A:
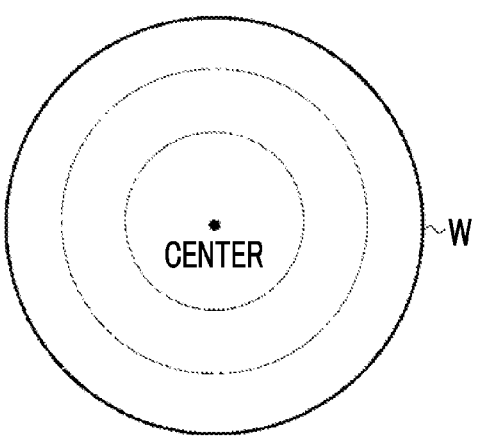
FIGS. 14A and 14B are diagrams illustrating a fourth method of detecting the adhesive state in an area unit according to the first example of the present invention.
Figure 14B:
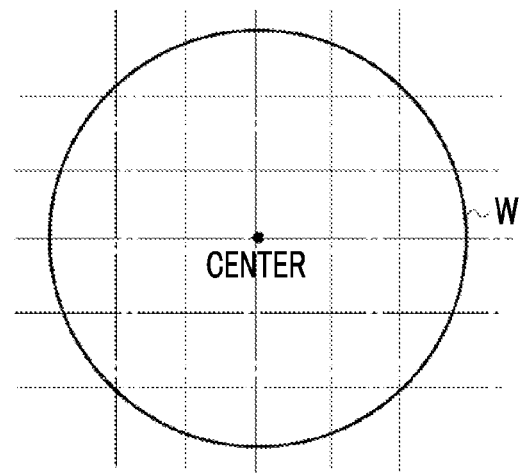

Next, a fourth method will be described. In the third method, an adhesive state is detected in a semiconductor substrate unit, and parameters are changed, but in the fourth method, an adhesive state is detected in multiple semiconductor chips of a semiconductor substrate, in other words, an adhesive state is detected in area units of a semiconductor substrate, and parameters are changed. In FIG. 14A, a semiconductor substrate is divided into multiple concentric areas, an average adhesive state is calculated from the adhesive states of one or multiple semiconductor chips included in each area, and the calculated average adhesive state is set to an adhesive state in an area unit. In addition, In FIG. 14B, a semiconductor substrate is divided into multiple rectangular areas, an average adhesive state is calculated from the adhesive states of one or multiple semiconductor chips included in each area, and the calculated average adhesive state is set to an adhesive state in an area unit. In the same manner as in the second method, also in the fourth method, adhesive states of the area units of a semiconductor substrate are stored in the storage unit 220 in advance, and when the pickup of a semiconductor chip in the corresponding area is performed, an adhesive state of the area is read, and parameters for each area are changed.

According to the fourth method, even if there is a difference of an adhesive state between the areas of a semiconductor substrate, parameters are changed in accordance with the adhesive states of the areas, and thus, a pickup control is performed with less failure than in a method of changing parameters in a substrate unit. In addition, time required for pickup is shortened more than in the first and second methods.

Second Example

Figure 15:
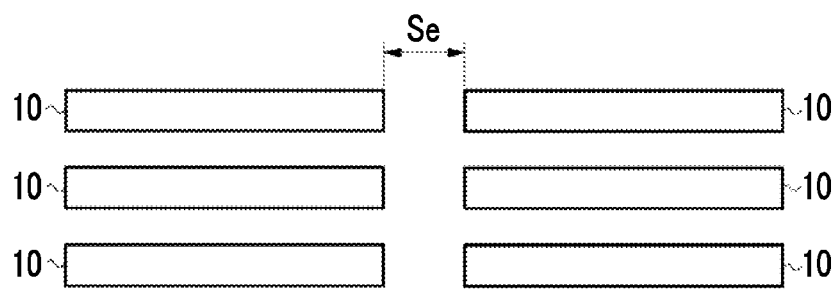
FIG. 15 is a schematic planar view of a front surface of a semiconductor substrate after an expanding step.
Figure 16:
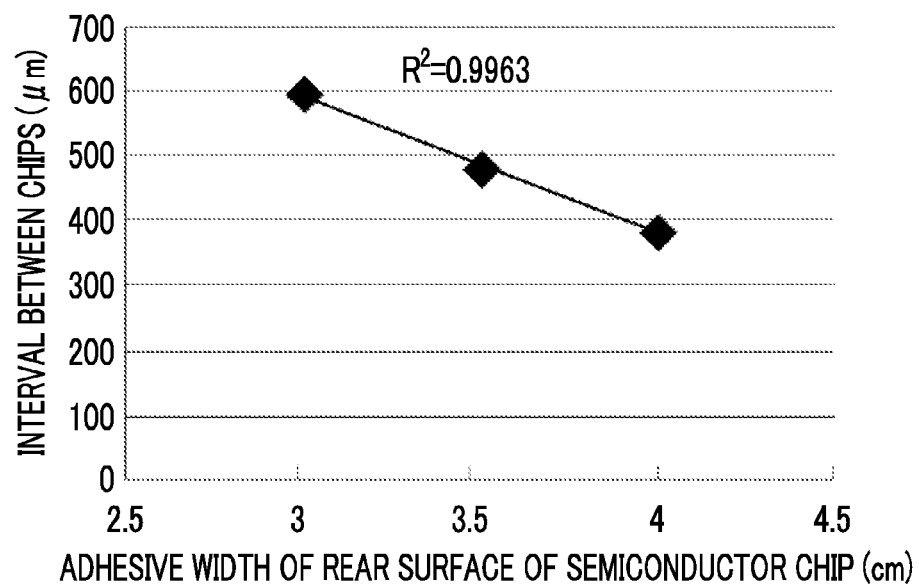
FIG. 16 is a graph illustrating a relationship between an adhesive width of an adhesive area of a rear surface of the semiconductor chip, and an interval between the semiconductor chips on a front surface side.

Next, a second example of the present invention will be described. In the first example, an adhesive state of a semiconductor chip is detected by observing a rear surface of the semiconductor chip across an adhesive tape from image capturing data which is obtained by capturing an image of the rear surface side of the semiconductor substrate, but in the second example, an adhesive state of a semiconductor chip is detected from a front surface side of a semiconductor substrate. FIG. 15 illustrates a planar view of a semiconductor chip on a front surface of a semiconductor substrate after an expanding step. Each of the semiconductor chips 10 is separated from each other by the interval S as illustrated in FIGS. 2A and 2B, but the interval S is expanded to an interval Se by the expanding step. The interval Se has a constant correlation with an adhesive state of a rear surface of a semiconductor chip. FIG. 16 is a graph illustrating a relationship between the adhesive width Wp of the adhesive area P of the semiconductor chip illustrated in FIG. 5, and the interval Se of a semiconductor chip on a front surface side of a substrate. As is apparent from FIG. 16, it may be seen that there is correlation between the adhesive width Wp and the interval Se. That is, the smaller the adhesive width Wp of a rear surface of a semiconductor chip is, the wider the interval Se is, and the greater the adhesive width Wp is, the narrower the interval Se is. If the adhesive width Wp of the rear surface of the semiconductor chip becomes smaller, adhesive force decreases, and thus, the interval Se becomes wider. If the adhesive width Wp becomes greater, the adhesive force increases, and thus, the interval Se becomes narrower. In this way, an inverse proportional relationship is established between the adhesive width Wp and the interval Se, and thus, an adhesive state of a rear surface of a semiconductor chip is detected by capturing an image of a front surface side of a semiconductor substrate using an image capturing camera, without observing the rear surface side of the semiconductor substrate using an image capturing camera.

Figure 17:
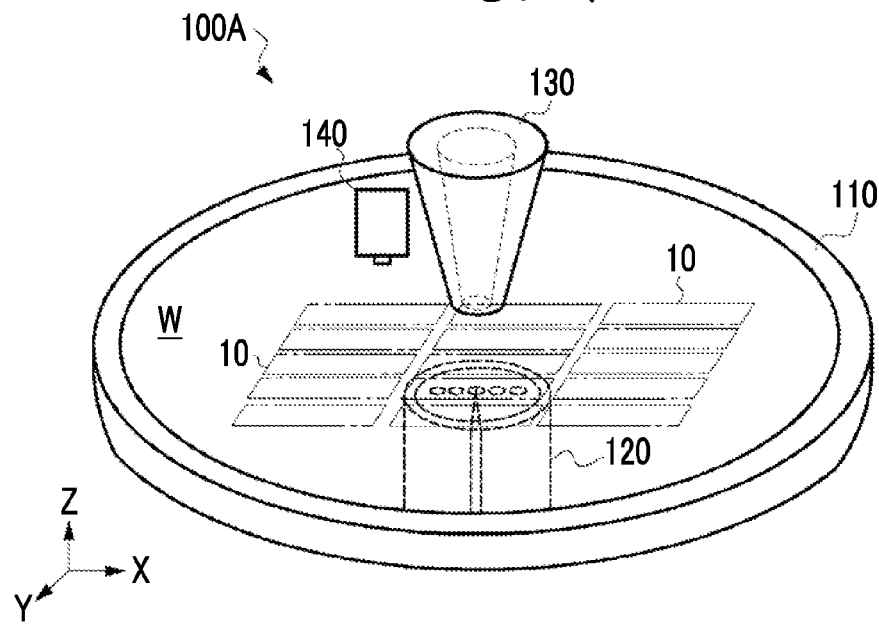
FIG. 17 is a schematic perspective view of the pickup device according to a second example of the present invention.

FIG. 17 is a schematic perspective view of the pickup device according to the second example. The same reference numerals will be attached to the same configuration as in FIGS. 1A and 1B. A pickup device 100A according to the second example has substantially the same configuration as the pickup device according to the first example, except for the lower image capturing camera 150.

FIG. 18 illustrates a flowchart in which pickup conditions according to the second example are automatically changed. The flowchart corresponds to the first method (FIG. 8)

according to the first example. After the expanding step (S300), a holding device which holds an adhesive tape including a semiconductor device is set over the stage 110 of the pickup device 100A (S302), and a pickup operation starts. The upper image capturing camera 140 captures an image of a front surface side of a semiconductor substrate (S304), the captured image data is analyzed by the image processing unit 210, and the analysis results are provided to the semiconductor chip recognition unit 282 and the adhesive state detection unit 284. The semiconductor chip recognition unit 282 recognizes a semiconductor chip to be picked up next (S306), and the stage drive unit 230 moves the stage 110 in the X and Y directions based on the recognized results for positioning the semiconductor chip in the push-up device 120. In parallel with this, the adhesive state detection unit 284 detects the interval Se of the semiconductor chip (S306). For example, edge detection is performed with respect to the captured image data and thereby an appearance of each semiconductor chip is detected, and the number of pixels between the detected appearances is set to the interval Se. Furthermore, the adhesive state detection unit 284 detects the adhesive width Wp or an adhesive area of a rear surface of a semiconductor chip by using the correlation illustrated in FIG. 16 (S308). The steps from step S310 to step S316 thereafter are the same as those of the first example. In addition, the second example may also be applied to any of the second method to the fourth method, which are described in the first example.

According to the second example, an adhesive state of a rear surface of a semiconductor chip is detected by using the image data which is obtained by the upper image capturing camera 140, and thus, it is possible to achieve miniaturization and low costs of the pickup device 100A.

In the present specification, "adhesive state" may be replaced with "magnitude of adhesive force" or "state that correlates with adhesive force". Furthermore, "adhesive state", "magnitude of adhesive force", or "state that correlates with adhesive force" may be replaced with "size of an adhesive area", "size of an adhesive width", or "size of an interval between semiconductor chips".

Furthermore, in the above-described examples, an adhesive state of a semiconductor chip is detected by using image data of an image capturing camera, but an operator may confirm an adhesive state with the naked eye, the operator sets an operation relevant to pickup in a pickup device based on the confirmed results, and the pickup device may be operated based on the setting.

Furthermore, in the above-described examples, a tape for dicing or a tape for expanding is described as an adhesive tape which is attached to a rear surface of a semiconductor substrate, but the adhesive tape may be a tape having the same function as that, and furthermore, may be a base material with flexibility or a member which is obtained by forming an adhesive layer, an adhesive layer, or the like on the base material, for example. In addition, a name of the adhesive tape is not limited to a tape, and may be a holding member having a sheet shape, for example, a resin, a film, or the like. Furthermore, an adhesive layer or a sticking layer which comes into close contact with a substrate may be a material such as an ultraviolet-curable type material, a material which is not an ultraviolet-curable type, an epoxy resin, or the like.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A semiconductor manufacturing device comprising:
an expanding unit that expands a holding member having an adhesive layer on which a substrate in a state of being diced into a plurality of semiconductor chips is held;
a detection unit that detects an adhesive state between one of the semiconductor chips and the holding member, in a state in which the holding member is expanded; and
a pickup unit that picks up the semiconductor chip by changing an operation relevant to pickup of the semiconductor chip based on the detected adhesive state,
wherein the detection unit detects a size of an adhesive area or a size of an adhesive width between the semiconductor chip and the holding member in a state in which the holding member is expanded as the adhesive state.

2. The semiconductor manufacturing device according to claim 1,
wherein the detection unit includes an image capturing unit which captures an image of the substrate, and detects the adhesive state based on the density of an image that is captured by the image capturing unit.

3. The semiconductor manufacturing device according to claim 1,
wherein the pickup unit includes a push-up unit which pushes up the holding member and the semiconductor chip from a side of a surface of the substrate to which the holding member adheres, and
wherein the push-up unit increases an amount of push-up of the semiconductor chip as the adhesive area or the adhesive width increases.

4. The semiconductor manufacturing device according to claim 1,
wherein the pickup unit includes an adsorbing unit which adsorbs the holding member to which the substrate adheres, and
wherein the adsorbing unit increases an adsorbing force as the adhesive area or the adhesive width increases.

5. The semiconductor manufacturing device according to claim 1,
wherein the pickup unit changes a time interval at which the semiconductor chip is picked up in response to the detected adhesive state.

6. The semiconductor manufacturing device according to claim 1,
wherein the pickup unit decreases a time interval at which the semiconductor chip is picked up as the adhesive area or the adhesive width increases.

7. The semiconductor manufacturing device according to claim 1,
wherein the detection unit detects the adhesive state for each region including a plurality of semiconductor chips in a same substrate, and
wherein the pickup unit changes an operation relevant to the pickup for each region in the substrate, based on the detected adhesive state.

8. A semiconductor manufacturing device comprising:
an expanding unit that expands a holding member having an adhesive layer on which a substrate in a state of being diced into a plurality of semiconductor chips is held:
a detection unit that detects an adhesive state between one of the semiconductor chips and the holding member, in a state in which the holding member is expanded; and
a pickup unit that picks up the semiconductor chip by changing an operation relevant to pickup of the semiconductor chip based on the detected adhesive state,
wherein the detection unit detects a size of an interval between the semiconductor chips in a state in which the holding member is expanded as the adhesive state.

9. The semiconductor manufacturing device according to claim 8,
wherein the pickup unit includes a push-up unit which pushes up the holding member and the semiconductor chip from a side of a surface of the substrate to which the holding member adheres, and
wherein the push-up unit decreases an amount of push-up of the semiconductor chip as the interval increases.

10. The semiconductor manufacturing device according to claim 8,
wherein the pickup unit includes an adsorbing unit which adsorbs the holding member to which the substrate adheres, and
wherein the adsorbing unit decreases the adsorbing force as the interval increases.

11. The semiconductor manufacturing device according to claim 8,
wherein the pickup unit increases a time interval at which the semiconductor chip is picked up as the size of an adhesive width between the semiconductor chip and the holding member decreases.

12. The semiconductor manufacturing device according to claim 1,
wherein the detection unit detects an adhesive state of a central area of the substrate in a radial direction or detects an average adhesive state in the radial direction, and
wherein the pickup unit changes an operation relevant to the pickup in each substrate, based on the detected adhesive state.

13. The semiconductor manufacturing device according to claim 1,
wherein the detection unit detects the adhesive state for each of the semiconductor chips in a same substrate, and
wherein the pickup unit changes an operation relevant to the pickup for each of the semiconductor chips in the substrate, based on the detected adhesive state.

14. A semiconductor manufacturing device comprising:
an expanding unit that expands a holding member having an adhesive layer on which a substrate in a state of being diced into a plurality of semiconductor chips is held;
a detection unit that detects an adhesive state between one of the semiconductor chips and the holding member, in a state in which the holding member is expanded: and
a pickup unit that picks up the semiconductor chip by changing an operation relevant to pickup of the semiconductor chip based on the detected adhesive state,
wherein the pickup unit includes an adsorbing unit whose lower side adsorbs the holding member to which the substrate adheres, and
wherein the adsorbing unit changes an adsorbing force based on the detected adhesive state.

15. A semiconductor manufacturing device comprising:
an expanding unit that expands a holding member having an adhesive layer on which a substrate in a state of being diced into a plurality of semiconductor chips is held;
a detection unit that detects an adhesive state between one of the semiconductor chips and the holding member, in a state in which the holding member is expanded: and
a pickup unit that picks up the semiconductor chip by changing an operation relevant to pickup of the semiconductor chip based on the detected adhesive state,
wherein the substrate includes a plurality of semiconductor chips, each having a shape such that the height thereof is greater than the width and length thereof, and
wherein the plurality of semiconductor chips have the same size, and
wherein the pickup unit changes the amount of push-up of one of the semiconductor chips, such that the stronger the adhesive force of the one of the semiconductor chips, the greater the amount the push-up of the one of the semiconductor chips increases in the same substrate, based on the detected adhesive state.

16. A semiconductor manufacturing device comprising:
an expanding unit that expands a holding member having an adhesive layer on which a substrate in a state of being diced into a plurality of semiconductor chips is held;
a detection unit that detects an adhesive state between one of the semiconductor chips and the holding member, in a state in which the holding member is expanded: and
a pickup unit that picks up the semiconductor chip by changing an operation relevant to pickup of the semiconductor chip based on the detected adhesive state,
wherein the substrate includes a plurality of semiconductor chips, each having a shape such that the height thereof is greater than the width and length thereof, and
wherein the plurality of semiconductor chips have the same size, and
wherein the pickup unit changes the amount of the adsorbing force with which the pickup unit adsorbs the holding member, such that the stronger adhesive force of one of the semiconductor chips, the stronger the adsorbing force for adsorbing downwardly the one of the semiconductor chips in the same substrate, based on the detected adhesive state.

17. A semiconductor manufacturing device comprising:
an expanding unit that expands a holding member having an adhesive layer on which a substrate in a state of being diced into a plurality of semiconductor chips is held;
a detection unit that detects an adhesive state between one of the semiconductor chips and the holding member, in a state in which the holding member is expanded: and
a pickup unit that picks up the semiconductor chip by changing an operation relevant to pickup of the semiconductor chip based on the detected adhesive state,
wherein the substrate includes a plurality of semiconductor chips, each having a shape such that the height thereof is greater than the width and length thereof, and
wherein the plurality of semiconductor chips have the same size, and
wherein the pickup unit changes a time interval between times in which one of the semiconductor chips is picked up, such that the stronger the adhesive force of the one of the semiconductor chips, the shorter a time in which the one of the semiconductor chips is picked up after an adjacent semiconductor chip is picked up, in the same substrate, based on the detected adhesive state.

* * * * *